US012703916B2

(12) United States Patent
Cho et al.

(10) Patent No.: US 12,703,916 B2
(45) Date of Patent: Aug. 11, 2026

(54) DEPOSITION APPARATUS AND DEPOSITION METHOD USING SAME

(71) Applicant: Samsung Display Co., LTD., Yongin-si (KR)

(72) Inventors: Youngsun Cho, Yongin-si (KR); Junhyeuk Ko, Yongin-si (KR); Myungkyu Kim, Yongin-si (KR); Young Kwang Lee, Yongin-si (KR); Seung Min Jin, Yongin-si (KR); Jae Min Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 538 days.

(21) Appl. No.: 18/336,207

(22) Filed: Jun. 16, 2023

(65) Prior Publication Data

US 2024/0044001 A1 Feb. 8, 2024

(30) Foreign Application Priority Data

Aug. 3, 2022 (KR) ........................ 10-2022-0096801

(51) Int. Cl.
*C23C 16/458* (2006.01)
*C23C 16/04* (2006.01)

(52) U.S. Cl.
CPC .......... *C23C 16/458* (2013.01); *C23C 16/042* (2013.01)

(58) Field of Classification Search
CPC .............................. C23C 14/50; C23C 16/458
See application file for complete search history.

(56) References Cited

U.S. PATENT DOCUMENTS

2016/0043319 A1* 2/2016 White .................... G02B 26/02 359/230
2020/0220114 A1* 7/2020 Ogata .................... C23C 14/50
2021/0328147 A1 10/2021 Vercesi et al.
2023/0317492 A1 10/2023 Kim et al.

(Continued)

FOREIGN PATENT DOCUMENTS

KR 10-2006-0068439 6/2006
KR 10-0796148 1/2008
KR 10-2012-0004067 1/2012

(Continued)

OTHER PUBLICATIONS

Kawato et al. WO2013183374 translation Dec. 2013 (Year: 2013).*

(Continued)

*Primary Examiner* — Cachet I Proctor
(74) *Attorney, Agent, or Firm* — CANTOR COLBURN LLP

(57) ABSTRACT

A deposition apparatus according to an embodiment includes a deposition source, and a deposition portion that faces the deposition source. The deposition portion is disposed at an angle of about 4 degrees to about 14 degrees with respect to an imaginary vertical line that is perpendicular to ground. The deposition portion includes a frame including an opening, and an outer portion disposed around the opening, a substrate disposed on a first side of the frame, and a plurality of back stages disposed on a second side opposite to the first side of the frame. The frame moves by movement of the plurality of back stages.

20 Claims, 22 Drawing Sheets
(12 of 22 Drawing Sheet(s) Filed in Color)

(56) References Cited

U.S. PATENT DOCUMENTS

| | | | |
|---|---|---|---|
| 2023/0363246 | A1 | 11/2023 | Cho et al. |
| 2024/0044001 | A1 | 2/2024 | Cho et al. |

FOREIGN PATENT DOCUMENTS

| | | | | | |
|---|---|---|---|---|---|
| KR | 10-2013-0009601 | | | 1/2013 | |
| KR | 20130009601 | A | * | 1/2013 | ............. C23C 14/50 |
| KR | 10-2015-0012806 | | | 2/2015 | |
| KR | 10-2016-0001886 | | | 1/2016 | |
| KR | 10-2020-0061751 | | | 6/2020 | |
| KR | 10-2023-0140665 | | | 10/2023 | |
| KR | 10-2024-0020301 | | | 2/2024 | |
| WO | WO-2013183374 | A1 | * | 12/2013 | ............. C23C 14/12 |

OTHER PUBLICATIONS

Kim et al. KR20130009601A translation. Jan. 2013 (Year: 2013).*
Extended European search report for European Patent Application or Patent No. 23189315.7 dated Jan. 18, 2024.

* cited by examiner

DEPOSITION APPARATUS AND DEPOSITION METHOD USING SAME

CROSS-REFERENCE TO RELATED APPLICATION(S)

This application claims priority to and benefits of Korean Patent Application No. 10-2022-0096801 under 35 U.S.C. § 119, filed in the Korean Intellectual Property Office on Aug. 3, 2022, the entire contents of which are incorporated herein by reference.

BACKGROUND

(a) Technical Field

The disclosure relates to a deposition apparatus and a deposition method using the same.

(b) Description of the Related Art

A light emitting display device is a self-light emitting display element, and has the merit of not only a wide viewing angle and excellent contrast but also a fast response speed, and thus it is attracting attention as the next generation display device.

A mask may be used when manufacturing a display device. Openings are defined in the mask, and constituent elements of the display device may be manufactured on the substrate through the openings. For example, in case that the display device includes a light emitting element, an organic material for manufacturing an emission layer of the light emitting element may be deposited on a substrate through the openings of the mask. The organic material for manufacturing a color filter may be deposited on the substrate through the openings of the mask.

The above information disclosed in this Background section is only for enhancement of understanding of the background of the disclosure, and therefore it may contain information that does not form the prior art that is already known in this country to a person of ordinary skill in the art.

SUMMARY

Embodiments provide a deposition apparatus with improved deposition pixel position accuracy (PPA), and a deposition method.

A deposition apparatus according to an embodiment may include a deposition source, and a deposition portion that faces the deposition source. The deposition portion may be disposed at an angle of about 4 degrees to about 14 degrees with respect to an imaginary vertical line that is perpendicular to ground. The deposition portion may include a frame including an opening, and an outer portion positioned around the opening, a substrate disposed on a first side of the frame, and a plurality of back stages disposed on a second side opposite to the first side of the frame. The frame may move by movement of the plurality of back stages.

The outer portion may include a first outer portion, a second outer portion, a third outer portion, and a fourth outer portion. The plurality of back stages may include four to five back stages for each of the first outer portion, the second outer portion, the third outer portion, and the fourth outer portion.

The plurality of back stages may move independently.

A movement distance of each of the plurality of back stages may be about 0 μm to about 200 μm.

The deposition source may spray deposition material in a first direction that is parallel to the ground.

The plurality of back stages may push the frame in a direction that is parallel to the first direction.

The plurality of back stages may be disposed closer to the deposition source than to the substrate.

The deposition apparatus may further include a plurality of lower stages disposed on a lower side disposed between the first side and the second side of the frame, wherein the frame may move by the movement of the plurality of lower stages.

A number of the plurality of lower stages may be four to five disposed on the lower side surface.

The plurality of lower stages may push the frame in a direction away from the ground.

The plurality of lower stages may move independently.

A movement distance of each of the plurality of lower stages may be about 0 μm to about 100 μm.

A deposition method according to an embodiment may include positioning a substrate on a frame of a deposition apparatus, moving the frame with a measurement value, and performing a deposition operation. The deposition apparatus may include a deposition source, and a deposition portion that faces the deposition source. The deposition portion may be disposed at an angle of about 4 degrees to about 14 degrees with respect to an imaginary line that is perpendicular to ground. The deposition portion may include a frame including an opening, and an outer portion disposed around the opening, a substrate disposed on a first side of the frame, and a plurality of back stages disposed on a second side opposite to the first side of the frame. The frame may move by movement of the plurality of back stages.

The moving of the frame with the measurement value may include pushing the frame in a first direction that is parallel with the ground according to a value.

A movement distance of the plurality of back stages may be about 0 μm to about 200 μm.

The outer portion may include a first outer portion, a second outer portion, a third outer portion, and a fourth outer portion. The plurality of backs stages may include four to five back stages for each of the first outer portion, the second outer portion, the third outer portion, and the fourth outer portion.

The deposition apparatus may further include a plurality of lower stages disposed on a lower side disposed between the first side and the second side of the frame.

In the moving of the frame with the measurement value, the plurality of lower stages may push the frame in a direction away from the ground.

A movement distance of each of the plurality of lower stages may be about 0 μm to about 100 μm.

In the moving of the frame with the measurement value, a deposition pixel position accuracy (PPA) distortion may be induced in a direction that is opposite to a direction in which the deposition PPA is distorted.

According to the embodiments, the deposition apparatus with improved deposition PPA and a deposition method can be provided.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE EMBODIMENTS

Figure 1:
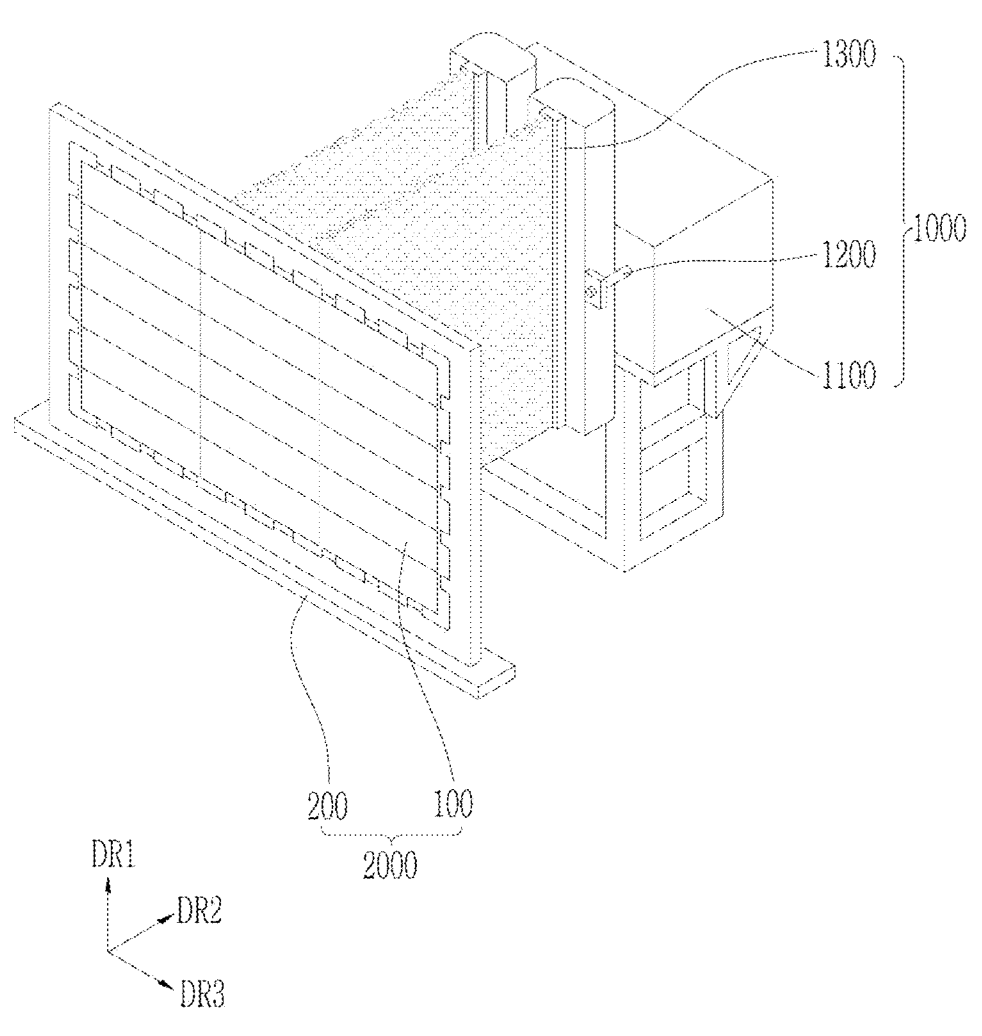
FIG. 1 schematically illustrates a structure of a deposition apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In order to clearly explain the disclosure, parts irrelevant to the description are omitted, and the same reference sign is designated to the same or similar constituent elements throughout the specification.

Since the size and thickness of each component shown in the drawing may be arbitrarily indicated for better understanding and ease of description, the disclosure is not necessarily limited to the size and thickness shown in the drawings.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element.

Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

The terms "face" and "facing" mean that a first element may directly or indirectly oppose a second element. In a case in which a third element intervenes between the first and second element, the first and second element may be understood as being indirectly opposed to one another, although still facing each other.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 schematically illustrates a structure of a deposition apparatus according to an embodiment. Referring to FIG. 1, a deposition apparatus according to an embodiment may have a vertical deposition structure. In this specification, vertical deposition structure is a concept contrasted with a horizontal deposition structure, and means a structure in which a substrate to be deposited is deposited in a standing state without being positioned (disposed) flat with respect to the ground. In this specification, a direction perpendicular with respect to the ground may be defined as a first direction DR1, and a direction flat with respect to the ground may be defined as a second direction DR2.

In FIG. 1, a deposition source 1000 and a deposition portion 2000 are illustrated.

The deposition source 1000 may include a vaporization portion 1100 where the deposition source is vaporized and a pipe portion 1200 connected to the vaporization portion 1100. A material vaporized in the vaporization portion 1100 may be delivered to a nozzle portion 1300 through the pipe portion 1200. The nozzle portion 1300 may be positioned lengthwise along the first direction DR1 and may spray a deposition material in the second direction DR2. The sprayed deposition material may be deposited on a substrate 100 of the deposition portion 2000. The deposition portion 2000 may include a frame 200, and the substrate 100 may be positioned on the frame 200.

The deposition material may be an organic material or an inorganic material.

The deposition portion 2000 is also positioned in a direction erected against the ground. The deposition portion 2000 may be positioned along the first direction DR1. Therefore, although it will be described separately later, the vertical type of deposition structure can minimize the sagging problem of the substrate 100 that may occur with the horizontal type of deposition structure and the resulting distortion in deposition accuracy (pixel position accuracy (PPA)). The deposition PPA may mean the degree to which a material to be deposited is accurately deposited on the pixel, and it means the degree of match between a pattern formed on a mask during deposition and a pattern formed through actual deposition. This can be caused by mask alignment errors, heat deformation in the process, and instrument deformation. Specifically, deposition may be performed in a chamber in a vacuum state, and deformation of the instrument may occur because of the vacuum state. Since high temperature heat may be used in the deposition process, thermal deformation due to heat may occur. In this specification, the deposition PPA can be derived by connecting the shape of each deposited pixel with a line and displaying it, and comparing the shape of the pixel before and after deposition.

In FIG. 1, a deposition portion 2000 is schematically shown as a frame 200 and a substrate 100 fixed to the frame 200. A detailed structure of the deposition portion 2000 will be described in detail later with reference to FIG. 3.

Figure 2:
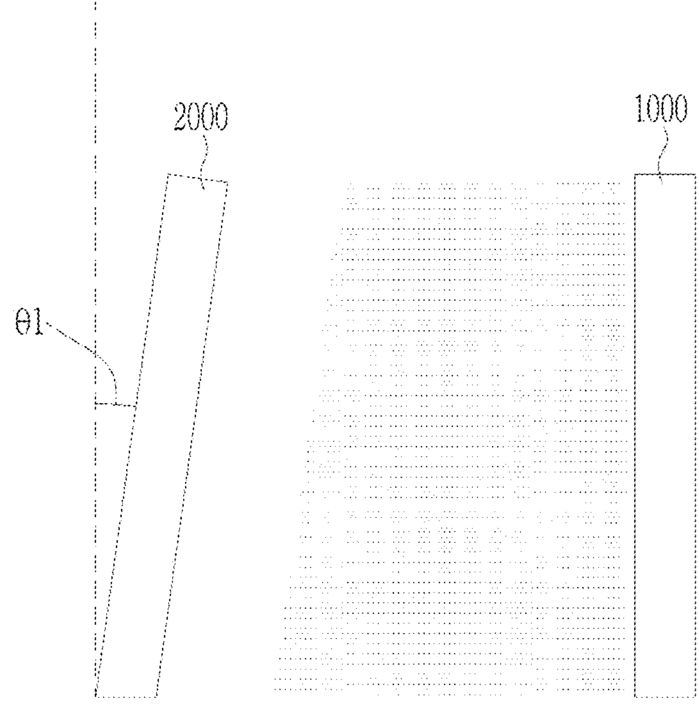
FIG. 2 schematically shows the configuration of the deposition source and the deposition portion to show the degree of inclination of the deposition portion.
Figure 2:
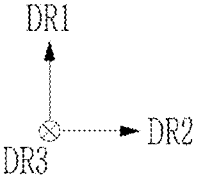

In FIG. 1, the deposition portion 2000 may be positioned by being inclined at a certain angle in a direction toward the deposition source 1000. FIG. 2 schematically shows the configuration of the deposition source 1000 and the deposition portion 2000 to show the degree of inclination of the deposition portion 2000. In FIG. 2, an inclined angle θ1 with respect to a virtual vertical line in which the deposition portion 2000 is positioned along the first direction DR1 may be about 4 degrees to about 14 degrees. This is an angle for a material ejected from the deposition source 1000 to settle well on the deposition portion 2000. Since the deposition portion 2000 may be inclined at a certain angle, the substrate 100 positioned on the deposition portion 2000 can be stably supported during the deposition process. In case that the deposition portion 2000 is positioned vertically, the substrate 100 may not be stably supported within the deposition portion 2000. However, in case that the inclination angle of the deposition portion 2000 exceeds about 14 degrees, a sagging problem of the substrate 100 may occur due to gravity. In case that the inclination angle of the deposition portion 2000 is less than about 4 degrees, the substrate 100 may not be stably supported. For example, about 4 degrees to about 14 degrees may be the angle at which the substrate can be stably supported while preventing the substrate from sagging, and deposition can be carried out effectively.

In an embodiment, the deposition source 1000 may also be positioned to be inclined. The deposition source 1000 may be positioned at the same angle as the deposition portion 2000 or inclined at a different angle. For example, the inclined angle with respect to the imaginary vertical line in which the deposition source 1000 may be positioned along the first direction DR1 may be about 4 degrees to about 14 degrees, but the disclosure is not limited thereto.

Figure 3:
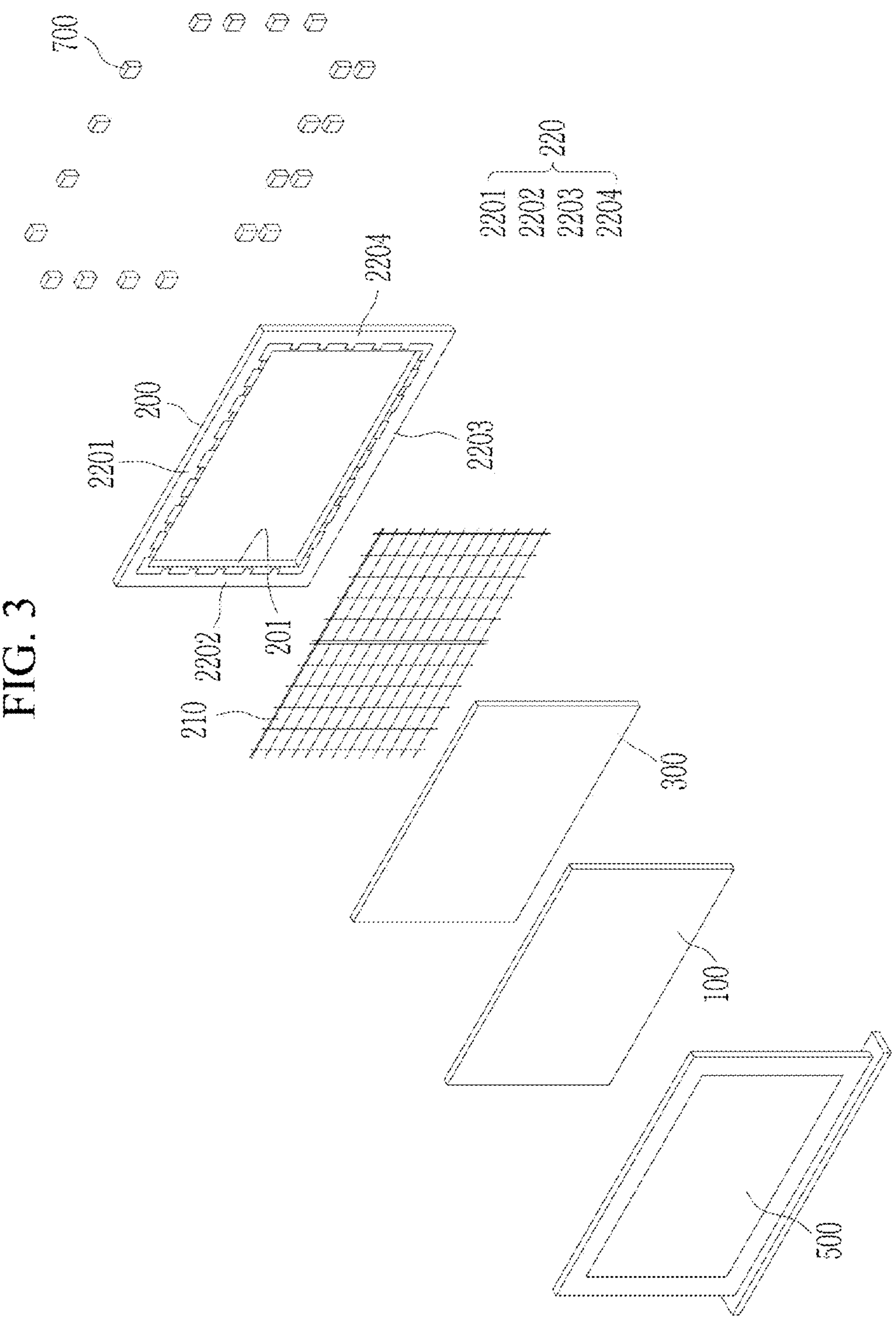
FIG. 3 schematically shows each structure constituting the deposition portion in isolation.

FIG. 3 schematically shows each structure that may constitute the deposition portion 2000 in isolation. Referring to FIG. 3, the deposition portion 2000 may include the frame 200, a mask fixing portion 210 positioned on the frame 200, a mask 300 positioned on the mask fixing portion 210, a substrate 100 positioned on the mask 300, and a fixing plate 500 positioned on the substrate 100. Multiple stages 700 may be positioned on the other side of the frame 200. In FIG. 3, the stage 700 may be positioned closest to the deposition source (not shown), and the fixing plate 500 may be positioned farthest from the deposition source. For example, the deposition source (not shown) can be positioned in the order of the stages 700, the frame 200, the mask fixing portion 210, the mask 300, the substrate 100, and the fixing plate 500.

An aspect of the disclosure is to minimize deposition PPA during deposition by disposing the stages 700 on a side of the frame 200 and properly lifting the frame 200 through the stages 700. The disposition and motion of specific stages 700 will be described in detail later.

The frame 200 may be a structure for supporting the substrate 100. The frame 200 may have an opening 201 to allow a material to be deposited on the substrate 100. An outer portion 220 may be positioned along the circumference of the opening 201 of the frame 200. As shown in FIG. 3, the outer portion 220 may be positioned in four directions. For convenience, four directions may be represented by east, west, south, and north to provide relative reference. Each outer portion 220 may be divided into a first outer portion 2201, a second outer portion 2202, a third outer portion 2203, and a fourth outer portion 2204. The first outer portion 2201, the second outer portion 2202, the third outer portion 2203, and the fourth outer portion 2204 may be connected to each other.

The substrate 100 may be supported while an edge of the substrate 100 may be supported by the outer portion 220. The outer portion 220 may include a side on which the substrate 100 is positioned and another side on which the substrate is not positioned. The stages 700 may be positioned on the other side of the substrate 100. For example, the substrate 100 and the stages 700 may be positioned with the frame 200 in between.

As shown in FIG. 3, the mask fixing portion 210 may have a lattice shape. The mask 300 may be positioned on the mask fixing portion 210. The mask 300 may be a fine metal mask (FMM). A pattern to be deposited on the substrate 100 may be formed on the mask 300. Therefore, the deposition material sprayed from the deposition source can be deposited on the substrate 100 in a desired shape after passing through the mask 300.

The substrate 100 may be fixed with the fixing plate 500. The fixing plate 500 may be positioned on the rear side of the substrate 100, for example, on the side where deposition may not be performed. The fixing plate 500 can stably fix the substrate 100 using static electricity.

In an embodiment, multiple stages 700 may be positioned in the outer portion 220 of the frame 200. Stages 700 may support the frame 200. Each stage 700 may correct the deposition PPA that is distorted during the deposition process by pushing the substrate 100 positioned on the frame 200 in a certain direction. The movement of the stages 700 may be performed by a method in which the position of a stage 700 moves or the length of the stage 700 changes.

Figure 4:
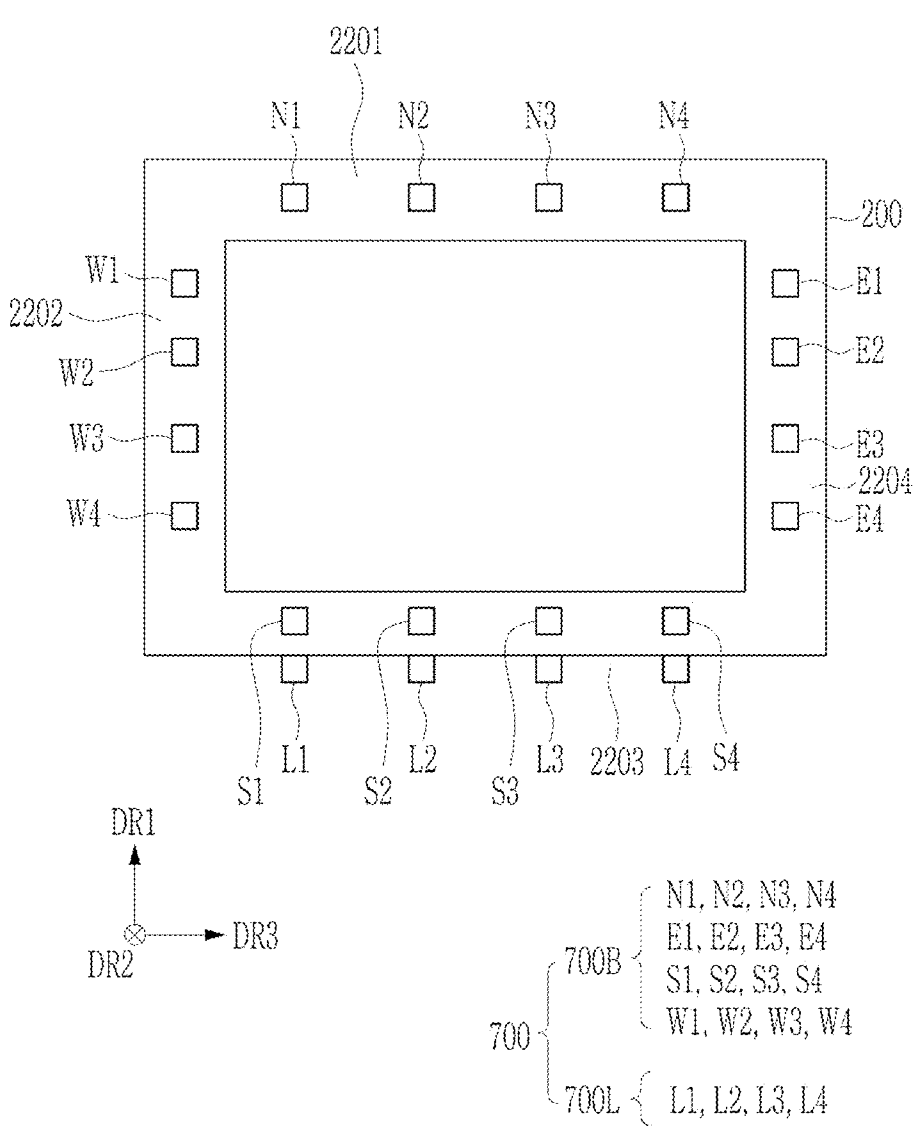
FIG. 4 schematically illustrates stages positioned in the frame.

FIG. 4 schematically illustrates stages 700 positioned in the frame 200. Referring to FIG. 4, at least one stage 700 may be positioned on each outer portion 220 of the frame 200. As shown in FIG. 4, at least one stage 700 is positioned in each of the first outer portion 2201, the second outer portion 2202, the third outer portion 2203, and the fourth outer portion 2204. Multiple stages 700 may be positioned. For example, four to five stages 700 may be positioned on each of the outer portions 2201, 2202, 2203, and 2204.

The shape of each stage 700 may be a quadrangle, but is not limited thereto. In case that a stage 700 is a quadrangle, a length of a side of the stage 700 may be about 80 mm to about 120 mm. However, the shape of a stage 700 is not limited thereto. Each stage 700 may move the frame 200 while moving in a direction.

When a side on which the substrate 100 of the frame 200 is positioned is referred to as a front side, the stages 700 may be positioned on the rear side of the frame 200. Stages 700 positioned on the rear side may be referred to as back stages 700B.

As shown in FIG. 4, multiple stages 700 may also be positioned on the lower surface of the frame 200. The stages 700 positioned on the lower side of frame 200 may be referred to as lower stages 700L.

The back stages 700B may push the frame 200 in the second direction DR2. The back stages 700B may push the frame 200 as a length of one or more back stages 700B increases, and the one or more back stages 700B may push the frame 200 while moving in the second direction DR2. The movement of a back stage 700B or the change in length of the back stage 700B will be referred to as a motion below. Each individual back stage 700B may be driven independently, and the frame 200 may be lifted in the second direction DR2 in a region where each back stage 700B is positioned. The motion length of each back stage 700B may be about 0 μm to about 200 μm. For example, each back stage 700B may push the frame 200 while moving or extending about 0 μm to about 200 μm in the second direction DR2.

A stage 700L may push the frame 200 in the first direction DR1. The frame 200 may be pushed while the length of a lower stage 700L is extended, or the frame 200 may be pushed while the lower stage 700L moves in the second direction DR2. Such movement of the back stages 700B or the motion of length extension will be referred to as a motion below. Each individual lower stage 700L may operate independently, and the frame 200 may be lifted with the first direction DR1 in a region where each lower stage 700L is positioned. A motion length of each lower stage 700L may be about 0 μm to about 100 μm. For example, each lower stage 700L may push the frame 200 while moving about 0 μm to about 100 μm in the first direction DR1 or increasing a thickness.

It may be possible to align the deposition PPA distorted during the deposition process by the motion of a stage 700. The effect of the disclosure will be described below.

In the case of the disclosure, since deposition may be performed with the substrate 100 standing upright, substrate sagging can be prevented compared to a horizontal deposition structure.

Figure 5:
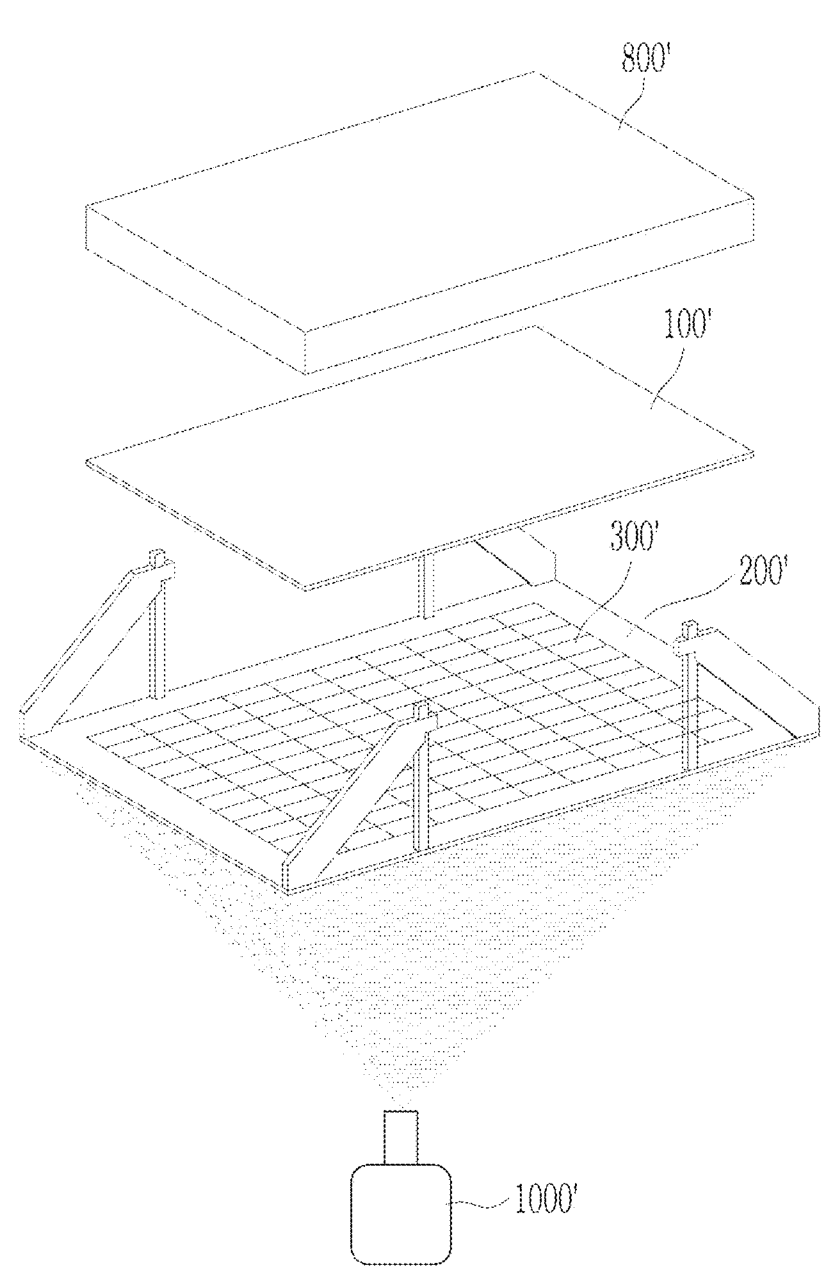
FIG. 5 schematically shows a deposition apparatus having a horizontal structure.

FIG. 5 schematically shows a deposition apparatus having a horizontal structure. Referring to FIG. 5, a deposition source 1000' may be positioned at the bottom and a deposition portion may be positioned horizontally with respect to the ground. Specifically, a substrate 100' may be positioned on a frame 200', and a plate 800' may be positioned on the substrate 100'. The plate 800' may fix the substrate 100'. As shown in FIG. 5, a mask 300' may be positioned on the frame 200'. In the structure shown in FIG. 5, the deposition source 1000' may spray the deposition material toward the top, and the deposition material may be deposited on the surface of the substrate 100' facing the ground.

Figure 6:
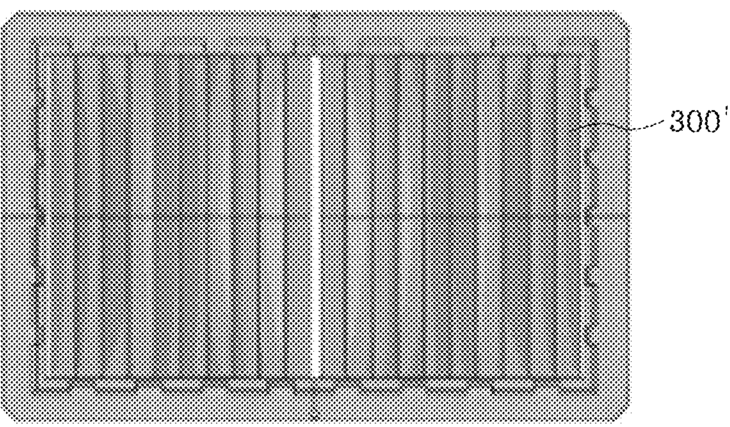
FIG. 6 schematically illustrates the mask before deposition in the structure of FIG. 5.

FIG. 6 schematically illustrates the mask 300' before deposition in the structure of FIG. 5. The degree of deformation of the mask 300 is shown in color. Referring to FIG. 6, it can be confirmed that the mask 300' shows a uniform color as a whole, and the mask before deposition is in a state of almost no deformation.

Figure 7:
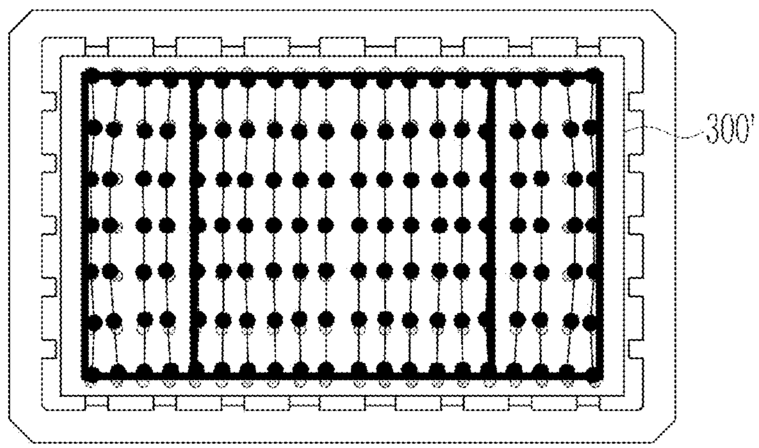
FIG. 7 schematically shows the shape of the pattern formed on the mask before deposition as a line.

FIG. 7 schematically shows the shape of the pattern formed on the mask 300' before deposition as a line.

Figure 8:
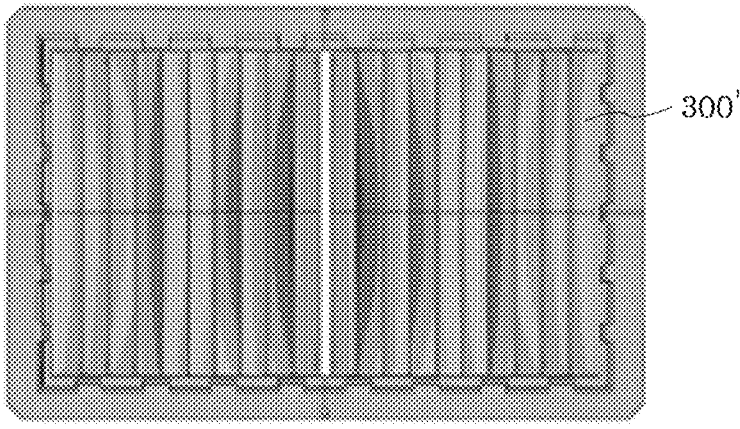
FIG. 8 schematically shows the mask after deposition.

FIG. 8 schematically shows the mask after deposition. The degree of deformation of the mask 300' is shown in color. Referring to FIG. 8, it can be confirmed that deformation may occur because the color of the mask is different for each region after the process. The deformation may be caused by the heat used in the deposition process.

Figure 9:
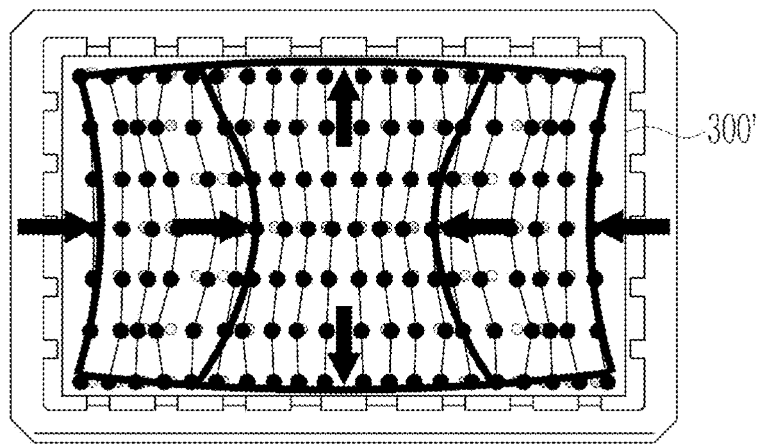
FIG. 9 schematically shows deposition pixel position accuracy (PPA) after deposition.

FIG. 9 schematically shows deposition PPA after deposition. Referring to FIG. 9, as described above, it can be confirmed that the deposition PPA may be distorted by instrument deformation and thermal deformation. Compared to the pattern of FIG. 7, which is before deposition, lines partitioning the deposition regions of the pixels may be twisted and bent. In FIG. 9, the direction in which the deposition PPA may be distorted is shown as an arrow. Distortion of the deposition PPA may occur due to thermal deformation caused by the heat used in the deposition process.

Figure 10:
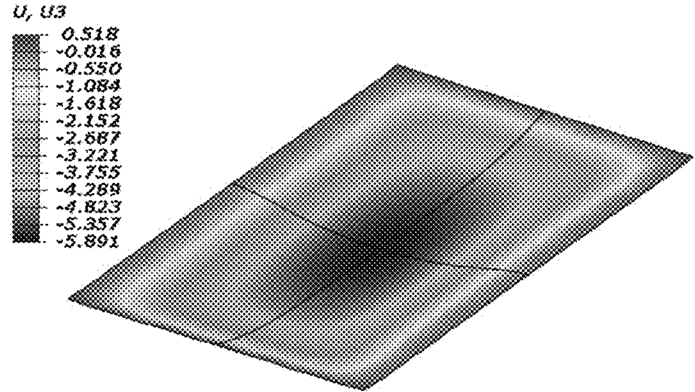
FIG. 10 schematically shows an image of the sagging of the substrate in the horizontal-type deposition apparatus.

The structure of FIG. 5 shows that the substrate 100' is positioned horizontally on the ground, and in case of using the substrate 100' in a large area, sagging due to gravity may appear in the central portion. FIG. 10 schematically shows an image of the sagging of the substrate 100' in the horizontal-type deposition apparatus. The height of the substrate is indicated by color. As shown in FIG. 10, it can be confirmed that the substrate 100' may be sagged due to gravity toward the center of substrate 100'. Due to the sagging of the substrate, the deposition material may not be accurately deposited in an intended region, thereby causing the deposition PPA distortion.

However, in the deposition apparatus according to an embodiment, the deposition portion 2000 may be vertically positioned. For example, the substrate 100' may be positioned horizontally and affected by gravity as shown in FIG. 5, but in the case of an embodiment, the substrate 100 may be positioned vertically close to perpendicular to minimize the influence of gravity. Therefore, distortion of the deposition PPA due to substrate sagging can be prevented. Since the substrate 100 may be positioned vertically, there may be no concern about substrate sagging, and thus a large-sized substrate can be deposited.

However, even in case that the substrate 100 is deposited while standing up, the problem of distorting the deposition PPA due to thermal deformation and instrument deformation may remain. Accordingly, the deposition apparatus according to an embodiment corrects the distorted deposition PPA by properly lifting the substrate 100 using one or more stages 700 positioned on the frame 200.

Figure 11:
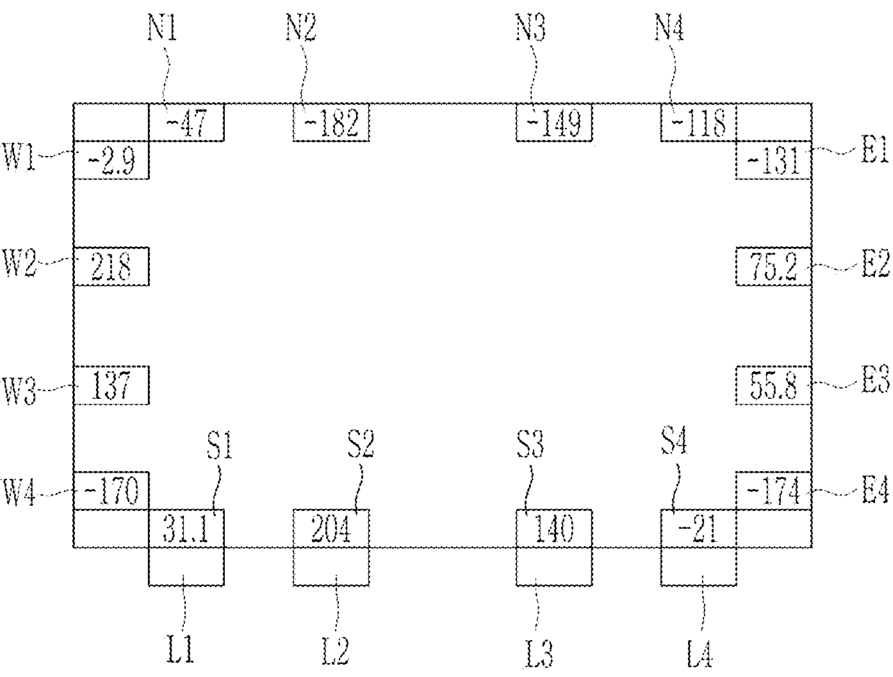
FIG. 11 schematically shows the plurality of stages positioned on the rear surface of the frame and flatness at the corresponding position.

FIG. 11 schematically shows the multiple stages 700 positioned on the rear surface of the frame 200 and flatness at the corresponding position. In FIG. 11, each stage positioned at each of the outer portions 2201, 2202, 2203, and 2204 of the frame 200 may be classified as N1, N2, N3, N4, W1, W2, W3, W4, S1, S2, S3, S4, E1, E2, E3, and E4. Stages L1, L2, L3, and L4 positioned on the lower side of frame 200 may be included.

In FIG. 11, the number written on each stage 700 may represent the flatness of the rear surface side of the frame 200. The measurement unit may be μm, and may mean lower than the original height, and a positive number may mean higher than the original height. Referring to FIG. 10, the flatness of each stage 700 may be different. For example, as shown in FIG. 10, the rear surface of the frame 200 may not be completely flat due to errors in the process such as thermal distortion and mechanical deformation, and the like, and a slight difference in height may occur for each region. Due to such non-uniform flatness, the deposition PPA may be distorted.

Figure 12:
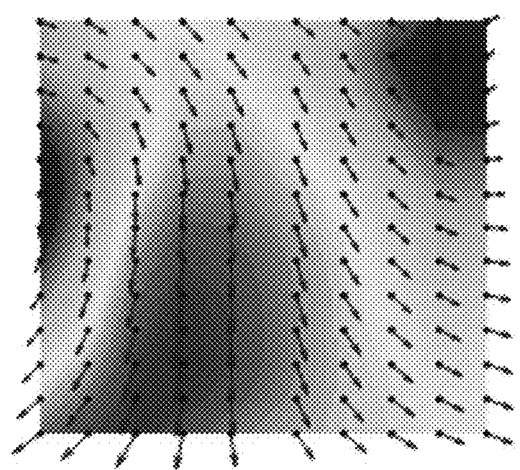
FIG. 12 schematically shows the distortion of the deposition PPA due to the flatness difference.

FIG. 12 schematically shows the distortion of the deposition PPA due to the flatness difference. In case that the deposition is carried out correctly, the same color appears, and in case that the deposition is not carried out correctly, as shown in FIG. 12, different colors are displayed. The portion marked with different colors in FIG. 12 may be a part where the deposition PPA is distorted, and the direction indicated by each arrow in FIG. 12 may be the direction in which the deposition PPA is distorted. Referring to FIG. 12, it can be confirmed that the deposition PPA is distorted in the direction from top to bottom. For example, in the case of an image like FIG. 12, it means that the deposition may be carried out below the original position.

Accordingly, the deposition apparatus according to an embodiment may solve the distortion of the deposition PPA by properly lifting the substrate 100 using each stage 700. For example, in case that deposition PPA distortion occurs, the substrate may be lifted using the stages 700 to induce deposition PPA distortion in the opposite direction. For example, in case that the deposition is carried out below the original position, the substrate 100 may be pushed using the stages 700 such that the deposition is carried out above the original position. Through this technique, the distortion of the deposition PPA that may occur can be offset.

FIG. 13 to FIG. 17 schematically show the distortion of the deposition PPA by position when each stage 700 is moved. The portions marked with different colors in FIG. 13 to FIG. 17 are parts where the deposition PPA may be distorted, and the direction indicated by each arrow in FIG. 13 to FIG. 17 is the direction in which the deposition PPA may be distorted.

Figure 13:
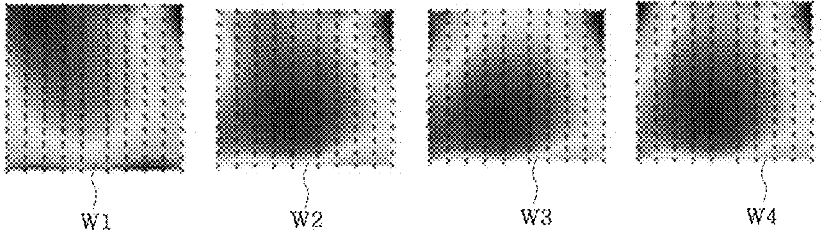
FIG. 13 to FIG. 17 schematically show the distortion of the deposition PPA by position in case that each stage is moved.

FIG. 13 shows directions in which the deposition PPA may be distorted in case that each of the four stages W1, W2, W3, and W4 positioned in a western outer portion 2202 of the frame 200 is lifted. The direction indicated by the arrow may be the direction in which the deposition PPA is distorted. For example, in case of lifting the W1 stage, distortion from the edge of the substrate 100 toward the center may appear. Therefore, in the deposition process, in case that deposition is distorted from the center of the substrate to the edge, the W1 stage may be lifted to induce distortion in the opposite direction (direction from the edge to the center) to offset the distorted deposition PPA.

Figure 14:
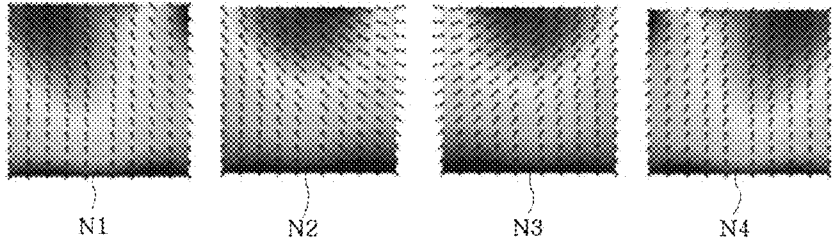

FIG. 14 shows directions in which the deposition PPA may be distorted in case that each of the four stages N1, N2, N3, and N4 positioned in a northern outer portion 2201 of frame 200 is lifted. The direction indicated by the arrow may be the direction in which the deposition PPA is distorted. For example, in case that the N2 stage is lifted, distortion from the edge of the substrate 100 to the center may appear. Therefore, in case that the deposition is shifted from the center of the substrate to the edge during the deposition process, the distortion of the deposition PPA can be offset by lifting the N2 stage and inducing distortion in the opposite direction.

Figure 15:
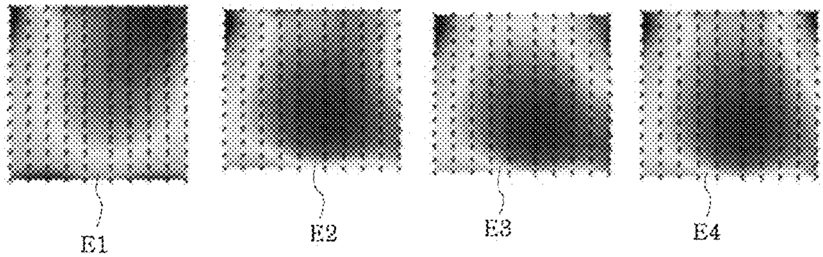

FIG. 15 shows the directions in which the deposition PPA may be distorted in case that each of the four stages E1, E2, E3, and E4 positioned in an eastern outer portion 2204 of frame 200 is lifted. The direction indicated by the arrow may be the direction in which the deposition PPA is distorted. For example, in case of lifting the E4 stage, distortion from the edge of the substrate 100 toward the upper center may appear. Accordingly, in the deposition process, in case that the deposition is shifted from the center of the substrate to the edge, the distortion of the deposition PPA can be offset by lifting the E4 stage and inducing distortion in the opposite direction.

Figure 16:
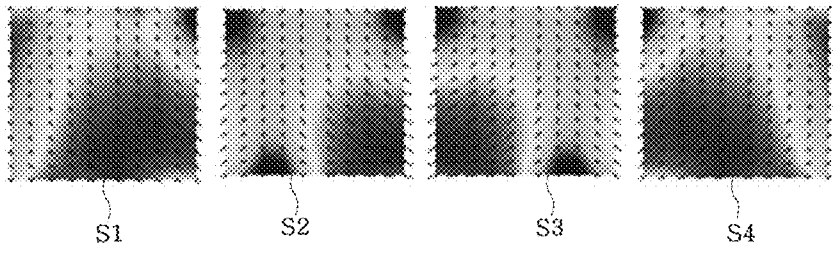

FIG. 16 shows the directions in which the deposition PPA may be distorted in case that each of the four stages S1, S2, S3, and S4 positioned in a southern outer portion 2203 of frame 200 is lifted. The direction indicated by the arrow may be the direction in which the deposition PPA is distorted. For example, in case that the S2 stage is lifted, a distortion may appear from the edge of the substrate 100 toward the upper center. Therefore, in the case where the deposition is shifted from the center of the substrate to the edge in the deposition process, the distortion of the deposition PPA can be offset by lifting the S2 stage and inducing the distortion in the opposite direction.

Figure 17:
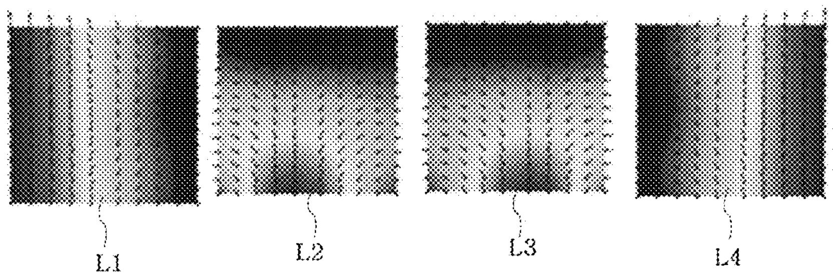

FIG. 17 shows the directions in which the deposition PPA may be distorted in case that each of the four stages L1, L2, L3, and L4 positioned at the bottom of frame 200 is lifted. The direction indicated by the arrow may be the direction in which the deposition PPA is distorted. For example, in case that the L1 stage is lifted, a distortion may appear from the bottom to the top of the substrate 100. Therefore, in the case where deposition is distorted from top to bottom during the deposition process, the deposition PPA distortion can be offset by lifting the L1 stage and inducing deposition deviation from bottom to top.

Figure 18:
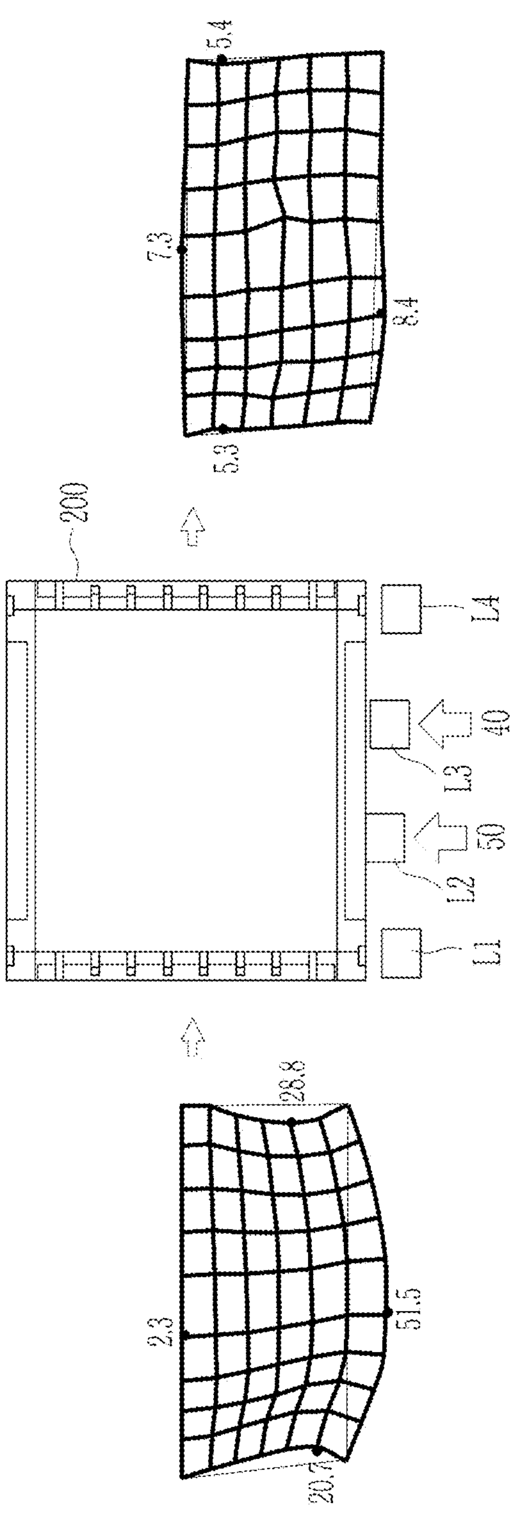
FIG. 18 schematically shows a simplified process of optimizing the deposition PPA by adjusting stages according to an embodiment.

FIG. 18 schematically shows a simplified process of optimizing the deposition PPA by adjusting the stage according to an embodiment. Referring to FIG. 18, the deposition PPA may be optimized using a stage for the substrate 100 with a distorted deposition PPA. FIG. 18 shows only the lower stages L1, L2, L3, and L4, but a back stage positioned on the rear side of the frame is included. The distorted deposition PPA can be adjusted by properly lifting the substrate using such stages.

In FIG. 18, the left side shows the distorted deposition PPA, and the center shows the process of correcting deposition PPA using stages, while the far right shows the deposition PPA controlled through this process. Compared to the left, which may be before adjustment, it can be confirmed that the deposition PPA, which may be distorted by the motion of the stages, may be significantly optimized. In the left figure of FIG. 18, the degree of distortion of each part is shown as in numbers. In the right figure of FIG. 18, the degree of distortion of each part is shown in numbers. Comparing the left and right figures of FIG. 18, it can be confirmed that the number representing the degree of distortion has decreased. Even in case that shapes rather than numerical values are compared, it can be confirmed that the right figure of FIG. 18 is more aligned. In the middle figure of FIG. 18, the numbers below L2 and L3 may mean the distance each stage moved, and the unit of measure may be μm.

Figure 19:
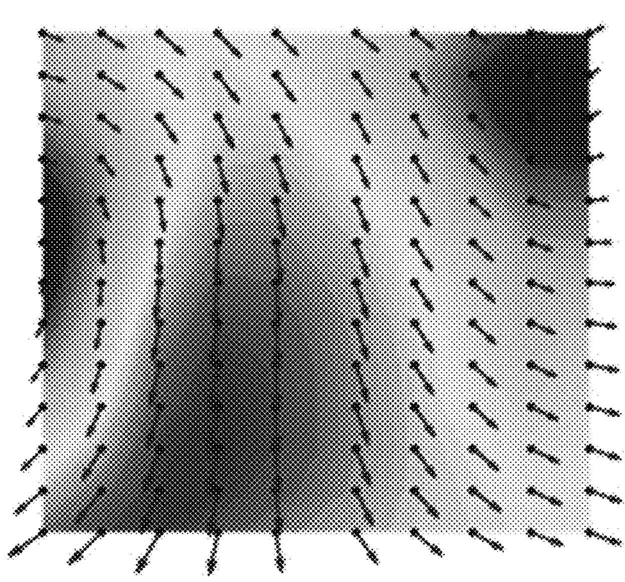
FIG. 19 to FIG. 21 schematically show images of the process of optimizing the deposition PPA by adjusting stages.
Figure 20:
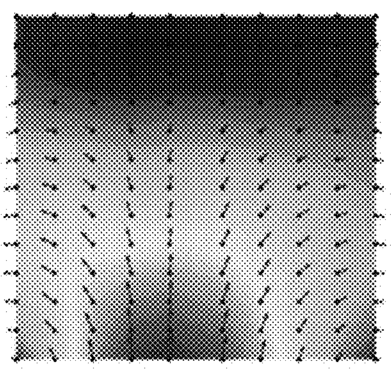
Figure 20:
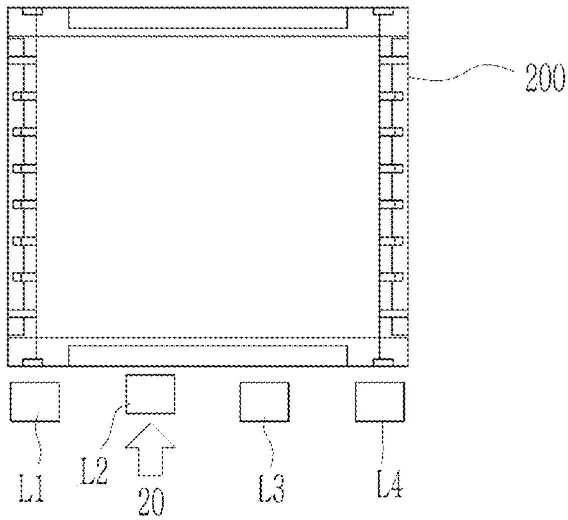
Figure 21:
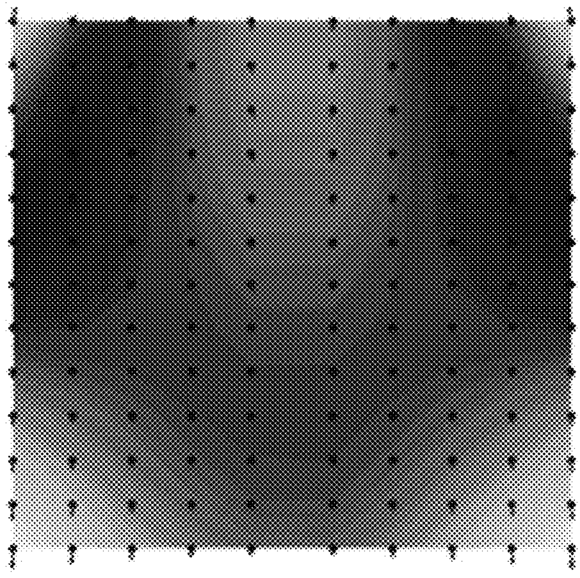

FIG. 19 to FIG. 21 schematically show images of the process of optimizing the deposition PPA by adjusting the stages. In FIG. 19 to FIG. 21, the portion marked with different colors may be a part where the deposition PPA is distorted, and the direction indicated by each arrow in FIG. 19 to FIG. 21 may be the direction in which the deposition PPA is distorted.

Referring to FIG. 19, a configuration in which deposition PPA is distorted is shown. Distortion of deposition PPA can be confirmed by an arrow direction and a non-uniform color. In FIG. 19, it can be confirmed that the deposition is mainly distorted in a direction from the upper left to the lower center.

In order to offset the distortion in FIG. 19, a deposition PPA distortion such as that shown in FIG. 20 may be induced using a stage. In FIG. 20, a configuration in which the L2 stage is lifted by about 20 μm is illustrated as an example. The image shown in FIG. 20 may be the same as the image when the stage L2 is lifted in FIG. 17. In case of lifting the L2 stage positioned on the rear side, a distortion from the bottom of the center to the top may occur. This may be the opposite direction to the distortion of FIG. 18.

In case that the distortion of FIG. 20 is added to the distortion of FIG. 19, the distortion in each opposite direction may be offset and thus the deposition PPA may be aligned without distortion. FIG. 21 shows an image where deposition is accurately carried out through this process. In FIG. 21, it can be confirmed that the deposition PPA may be uniformly aligned without distortion through the uniform color and arrow direction. In FIG. 19 to FIG. 21, a configuration in which only one stage may be moved is described, but this is only an example, and multiple stages can be moved in each position to adjust the deposition PPA.

Figure 22:
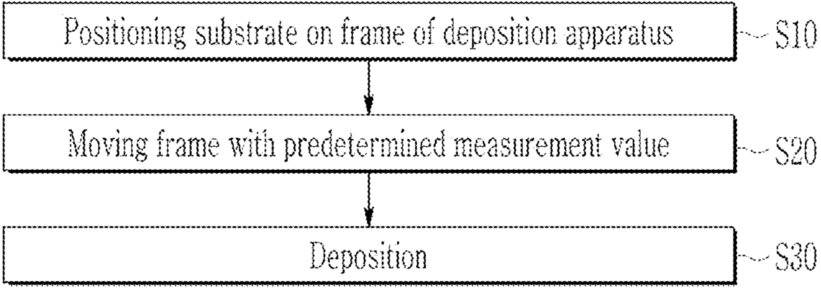
FIG. 22 schematically shows a deposition method using a deposition device according to an embodiment.

FIG. 22 schematically shows a deposition method using a deposition device according to an embodiment. Referring to FIG. 22, a deposition method includes positioning the substrate on the frame of the deposition apparatus (S10), moving the frame with a measurement value (e.g., predetermined or selectable measurement value)(S20), and deposition (S30).

A deposition apparatus used in S10 for the positioning of the substrate on the frame of the deposition apparatus may be the same as described above. A detailed description of the same constituent elements is omitted. For example, the deposition apparatus may include a deposition source and a deposition portion facing a deposition source, and the deposition portion may be positioned at an angle of about 4 degrees to about 14 degrees with respect to a virtual vertical line that may be perpendicular to the ground. The deposition portion may include an opening and a frame including an outer portion positioned around the opening, and multiple stages may be positioned on a surface of the frame, and the frame may move by movement of the stages.

In S20 of the moving of the frame to the measurement value, the measurement value may be a value for correcting the deposition distortion that occurs in the deposition process. For example, this may be a value derived from the previous deposition process, and through this step, it may be possible to prevent the deposition PPA of the deposition process from being distorted. The moving of the frame may use a frame 200 where the substrate 100 may be positioned and multiple stages 700 positioned on the frame 200 as described above.

In the deposition S30, the deposition source may spray a deposition material in a second direction DR2 parallel to the ground, and may be deposited on the substrate 100 standing in a first direction DR1 that may be perpendicular to the ground.

While this disclosure has been described in connection with what is considered to be practical embodiments, it is to be understood that the disclosure is not limited to the disclosed embodiments. The disclosure should be interpreted to cover various modifications and equivalent arrangements included within the spirit and scope of the disclosure.

What is claimed is:

1. A deposition apparatus comprising:
a deposition source; and
a deposition portion that faces the deposition source, wherein
the deposition portion is disposed at an angle of about 4 degrees to about 14 degrees with respect to an imaginary vertical line that is perpendicular to ground,
the deposition portion comprises:
a frame including:
an opening; and
an outer portion disposed around the opening;
a substrate disposed on a first side of the frame; and
a plurality of back stages disposed on a second side opposite to the first side of the frame, and
the frame moves by movement of the plurality of back stages.

2. The deposition apparatus of claim 1, wherein
the outer portion comprises:
a first outer portion;
a second outer portion;
a third outer portion; and
a fourth outer portion, and
the plurality of back stages include four to five back stages for each of the first outer portion, the second outer portion, the third outer portion, and the fourth outer portion.

3. The deposition apparatus of claim 1, wherein
the plurality of back stages move independently.

4. The deposition apparatus of claim 1, wherein
a movement distance of each of the plurality of back stages is about 0 μm to about 200 μm.

5. The deposition apparatus of claim 1, wherein
the deposition source sprays deposition material in a first direction that is parallel to the ground.

6. The deposition apparatus of claim 5, wherein
the plurality of back stages push the frame in a direction that is parallel to the first direction.

7. The deposition apparatus of claim 1, wherein
the plurality of back stages are disposed closer to the deposition source than to the substrate.

8. The deposition apparatus of claim 1, further comprising a plurality of lower stages disposed on a lower side disposed between the first side and the second side of the frame,
wherein the frame moves by the movement of the plurality of lower stages.

9. The deposition apparatus of claim 8, wherein
a number of the plurality of lower stages is four to five disposed on the lower side surface.

10. The deposition apparatus of claim 8, wherein
the plurality of lower stages pushes the frame in a direction away from the ground.

11. The deposition apparatus of claim 8, wherein
the plurality of lower stages move independently.

12. The deposition apparatus of claim 8, wherein
a movement distance of each of the plurality of lower stages is about 0 μm to about 100 μm.

13. A deposition method comprising:
positioning a substrate on a frame of a deposition apparatus;
moving the frame; and
performing a deposition operation, wherein
the deposition apparatus comprises:
a deposition source; and
a deposition portion that faces the deposition source, and
the deposition portion is disposed at an angle of about 4 degrees to about 14 degrees with respect to an imaginary line that is perpendicular to ground,
the deposition portion comprises:
a frame including:
an opening; and
an outer portion disposed around the opening;
a substrate disposed on a first side of the frame; and
a plurality of back stages disposed on a second side opposite to the first side of the frame, and
the frame moves by movement of the plurality of back stages.

14. The deposition method of claim 13, wherein
the moving of the frame comprises pushing the frame in a first direction that is parallel with the ground.

15. The deposition method of claim 13, wherein
a movement distance of the plurality of back stages is about 0 μm to about 200 μm.

16. The deposition method of claim 13, wherein
the outer portion comprises:
a first outer portion;
a second outer portion;
a third outer portion; and
a fourth outer portion, and
the plurality of back stages include four to five back stages for each of the first outer portion, the second outer portion, the third outer portion, and the fourth outer portion.

17. The deposition method of claim 13, wherein
the deposition apparatus further comprises a plurality of lower stages disposed on a lower side disposed between the first side and the second side of the frame.

18. The deposition method of claim 17, wherein
in the moving of the frame, the plurality of lower stages push the frame in a direction away from the ground.

19. The deposition method of claim 18, wherein
a movement distance of each of the plurality of lower stages is about 0 μm to about 100 μm.

20. The deposition method of claim 13, further comprising:
confirming that a deposition pixel position (PPA) accuracy is distorted in a first direction,
wherein the moving of the frame comprises inducing a PPA distortion in a second direction that is opposite to the first direction.

* * * * *